United States Patent
Groe (10) Patent No.: US 7,764,139 B1
(45) Date of Patent: Jul. 27, 2010

(54) POLAR MODULATION WITH EXTENDED AM

(75) Inventor: John B. Groe, Poway, CA (US)

(73) Assignee: Quintic Holdings, Santa Clara, CA (US)

(*) Notice: Subject to any disclaimer, the term of this patent is extended or adjusted under 35 U.S.C. 154(b) by 53 days.

(21) Appl. No.: 12/324,992

(22) Filed: Nov. 28, 2008

Related U.S. Application Data (60) Provisional application No. 60/990,889, filed on Nov. 28, 2007.

(51) Int. Cl.
*H03C 3/00* (2006.01)
*H03C 3/38* (2006.01)

(52) U.S. Cl. ........................ 332/145; 332/103
(58) Field of Classification Search ......... 332/103–105, 332/117, 119, 144, 145, 149, 151
See application file for complete search history.

(56) References Cited

U.S. PATENT DOCUMENTS

2006/0217086 A1* 9/2006 Mekechuk et al. .......... 455/126

\* cited by examiner

*Primary Examiner*—David Mis
(74) *Attorney, Agent, or Firm*—Blairtech Solution (57) ABSTRACT

Apparatus and methods for adjusting spectral characteristics of a polar modulation signal in a polar modulator are described. A detection circuit is configured to determine when an FM signal component of the modulation signal exceeds a threshold value. The output of the detection circuit is coupled with FM and AM mapping circuits to selectively map the FM signal component and an AM signal component of the modulation signal to mapped signals, thereby reducing FM deviation.

22 Claims, 10 Drawing Sheets

An embodiment of an FM folding process in accordance with the invention

FIG. 1
WCDMA Transmit Signal Plotted on Complex Plane

FIG. 2
Simple Polar Transmitter
(Prior Art)

FIG. 3A

Diagram of Fractional-N- PLL with Delta-Sigma Modulator (Prior Art)

FIG. 3B

Noise contribution of ΔΣ Modulator

FIG. 4A

Phase Frequency Modulation System (Prior Art)

FIG. 4B

Response of each FM path

FIG. 5A
Dual Port VCO
(Prior Art)

FIG. 5B
Response at Modulation Port

FIG. 6
FM for a typical WCDMA signal

FIG. 7A

An embodiment of an FM folding process
in accordance with the invention

FIG. 7B

Resulting FM Signal

FIG. 7C

Resulting AM Signal

FIG. 8

Power Spectral Density (PSD) of Polar Components after Implementing AM Extension in Accordance with the Invention

FIG. 9

An Embodiment of an AM Inverting Circuit

POLAR MODULATION WITH EXTENDED AM

CROSS REFERENCE TO RELATED APPLICATIONS

This application claims priority under 35 U.S.C. §119(e) to U.S. Provisional Patent Application Ser. No. 60/990,889, entitled POLAR MODULATION WITH EXTENDED AM, filed on Nov. 28, 2007. This application is also related to U.S. Pat. No. 6,985,703, entitled DIRECT SYNTHESIS TRANSMITTER, issued Jan. 10, 2006, to U.S. Pat. No. 6,774,440 entitled SYSTEM FOR HIGHLY LINEAR PHASE MODULATION, issued Aug. 10, 2004, to U.S. patent application Ser. No. 12/251,342 entitled APPARATUS AND METHODS FOR FM PULSE SHAPING, filed Oct. 12, 2008, to U.S. patent application Ser. No. 12/249,725, entitled APPARATUS AND METHODS FOR POLAR MODULATION WITH IQ ZEROING, filed Oct. 10, 2008, and to U.S. patent application Ser. No. 11/369,897, entitled LINEAR WIDEBAND PHASE MODULATION SYSTEM, filed Mar. 6, 2006. The content of each of these applications is hereby incorporated by reference herein in its entirety for all purposes.

FIELD OF THE INVENTION

The present invention relates generally to radio transmitters using polar modulation. More particularly but not exclusively, the present invention relates to apparatus and methods for reshaping FM impulses without adversely affecting the spectrum of a composite transmit signal.

BACKGROUND

Radio transmitters are used to generate the modulated signals required for wireless communications using modulation techniques such as QPSK, 8-PSK, 16-QAM, 64-QAM, and OFDM to vary the amplitude, phase, and/or frequency of the transmitter's RF carrier.

The modulated signal represents and conveys the message data consisting of in phase (I) and quadrature (Q) data streams. In practice, these data streams pass through digital filters that shape the resulting pulses and ultimately define the spectrum of the modulated transmit signal. A polar transmitter translates these I and Q data streams to equivalent amplitude (AM) and phase (PM) modulation signals. This allows these signals to be applied at more advantageous points in the transmitter increasing its efficiency.

Figure 1:
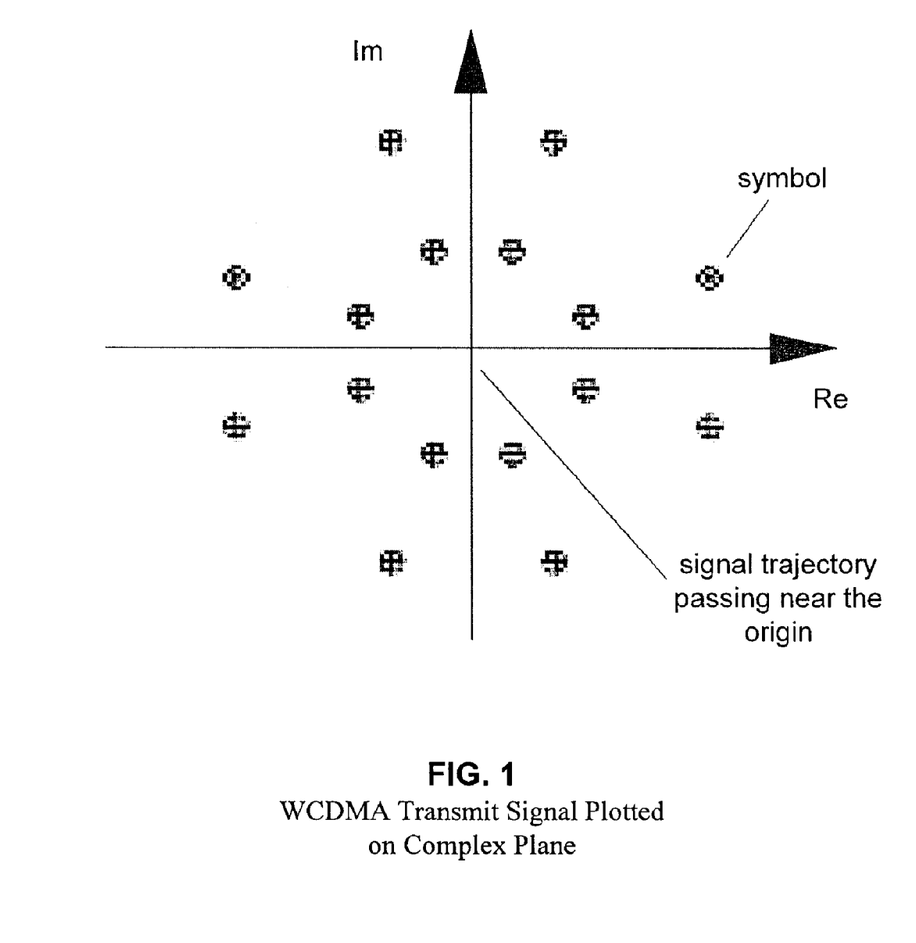
FIG. 1 shows the complex signal trajectory for a representative WCDMA transmit signal.

The PM signal is applied to the RF carrier at a phase-locked loop (PLL). In practice, this is actually accomplished using the equivalent frequency modulation (FM) signal, which is easily found by differentiating the PM signal. Unfortunately, the differentiation process widens the bandwidth of the FM signal and also generates impulses. This is due to the fact that the phase jumps by as much as π whenever the transmit signal passes through or near the origin of the complex plane as shown in FIG. 1. The resulting FM impulses (that occur after differentiating the phase jumps), although infrequent, can be as strong as one-half of the data rate.

The FM signal's impulses and wide bandwidth present daunting challenges to the design of the polar transmitter. Any distortion of the FM signal alters the spectrum of the VCO output, elevates the noise floor around the transmit signal, and rotates the complex signal pattern. Practical circuits invariably reduce the bandwidth of the FM signal and degrade performance. More importantly, the VCO and PLL limit the peak FM deviation and corrupt the transmit output spectrum. It would therefore be advantageous to reduce the peak FM deviation as well as the bandwidth of the FM signal.

SUMMARY

The present invention relates generally to apparatus and methods for reshaping FM impulses without adversely affecting the spectrum of a composite transmit signal used in a polar modulation system.

In one aspect, the present invention relates to an apparatus for reducing FM deviation in a polar modulator including a detection circuit configured to determine when an FM signal component of a modulation signal applied to said polar modulator has exceeded a predetermined deviation, an FM processing circuit including an FM mapping circuit configured to selectively map the FM signal to a mapped FM signal having a reduced FM deviation, where the FM mapping is responsive to the determining, and an AM processing circuit including an AM mapping circuit configured to selectively map an AM signal component of the modulation signal to a mapped AM signal, where the AM mapping is responsive to said determining.

In another aspect, the present invention relates to a method for reducing FM deviation in a polar modulator comprising determining when an FM signal component of a modulation signal applied to the polar modulator has exceeded a predetermined deviation, selectively mapping the FM signal to a mapped FM signal having a reduced FM deviation, where the mapping is responsive to the determining, and selectively mapping an AM signal component of the modulation signal to a mapped AM signal, where the mapping is responsive to the determining.

In another aspect, the present invention relates to A polar modulator comprising a VCO having AM and FM input ports and a modulation output port, a detection circuit configured to determine when an FM signal component of a modulation signal applied to said polar modulator has exceeded a predetermined deviation, an FM processing circuit including an FM mapping circuit configured to generate a mapped FM signal by subtracting, responsive to said determining, an amount representative of said predefined threshold from said FM signal, said mapped FM signal coupled to an FM input port of said VCO, and an AM processing circuit including an AM mapping circuit configured to generate a mapped AM signal by inverting, responsive to the determining, the polarity of an AM signal component of the modulation signal, where the mapped AM signal is coupled to an AM input port of the VCO.

Additional aspects of the present invention are described below with respect to the appended Drawings.

BRIEF DESCRIPTION OF THE DRAWINGS

The following is a brief description of the drawings wherein.

DETAILED DESCRIPTION

Figure 2:
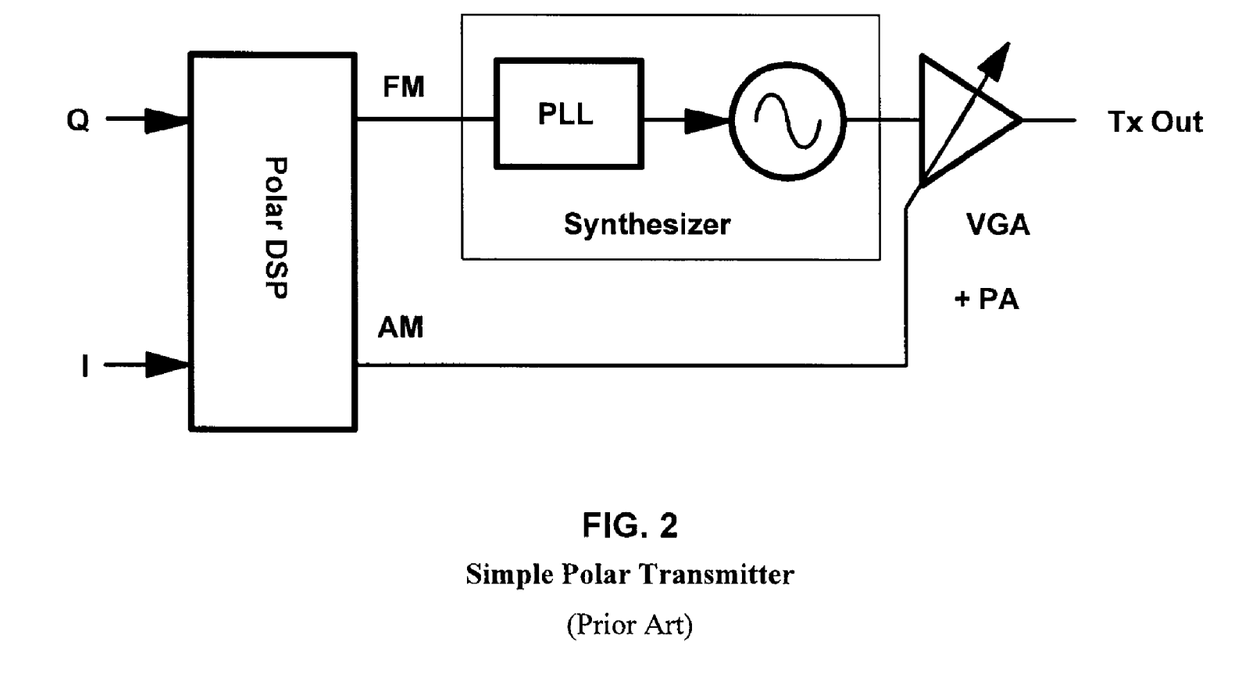
FIG. 2 shows a diagram of simple polar transmitter.

A simple diagram of a polar transmitter is shown in FIG. 2. It synthesizes the transmit signal using direct phase modulation at the synthesizer and amplitude modulation at the variable gain amplifier (VGA) or power amplifier (PA).

Figure 3A:
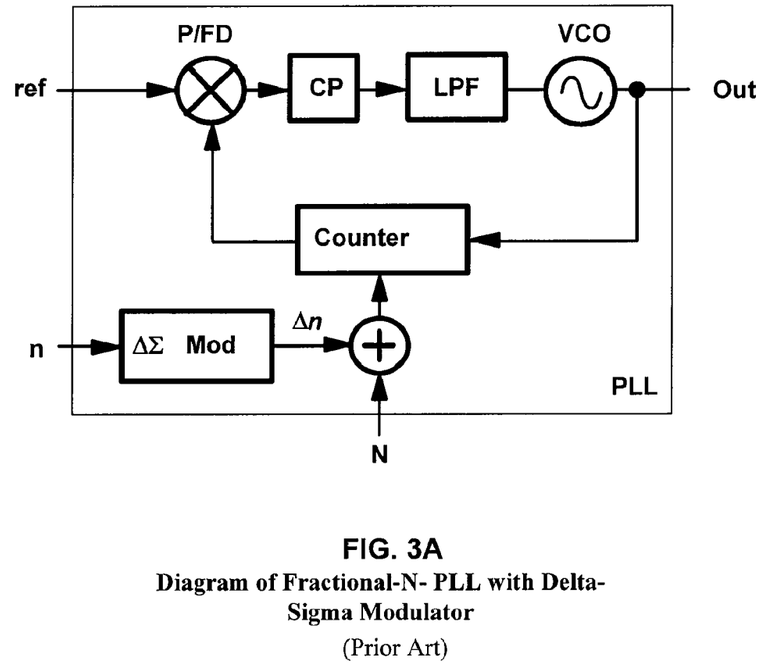
FIG. 3A shows a diagram of a fractional N PLL used to synthesize an RF carrier signal.

FIG. 3A shows a fractional-N phase-locked loop (PLL) used to synthesize the radio frequency (RF) carrier signal. The PLL forms a feedback system that consists of a voltage-controlled oscillator (VCO), N counter, phase/frequency detector (P/FD), charge pump (CP), and integration filter.

The PLL uses negative feedback to force the phase of the feedback signal to track the phase of the reference signal. As a result, the VCO oscillates at a frequency given by $$f_{VCO} = f_{REF}(N+n)$$

where n represents the fractional value and N equals the integer value.

The fractional-N phase-locked loop resolves fine frequency steps by modulating the value of $\Delta n$ so that its average value satisfies $$n = \frac{\Delta f}{f_{REF}} = \frac{1}{M}\sum_{i=1}^{M} \Delta n_i$$

The $\Delta\Sigma$ modulator forms a sequence of $\Delta n$ values with these important properties: 1) it responds to the input n quickly, 2) it possesses a resolution that improves with the number of samples, and 3) it concentrates quantization noise at high frequencies, near one-half the clock frequency.

The quantization noise can be attributed to the integer nature of the feedback counter. It possesses a quantization error of $\pm\frac{1}{2}$ around N or $$\Delta = \frac{1}{N}$$

Assuming a uniform distribution of this error leads to the noise spectral density function described by $$e_{rms}^2(f) = \frac{1}{12N^2 f_{REF}}$$

The $\Delta\Sigma$ modulator found in this polar transmitter shapes the quantization noise according to the transfer function $$\Delta\Sigma(z) = (1-z^{-1})^L$$

where L is the order of the modulator. It in turn feeds the feedback counter, which acts a digital accumulator and reduces its noise-shaping effects. That is, the feedback counter operates in such a way that the current output phase depends on its previous output phase. As a result, the transfer function of the feedback counter or prescalar becomes $$P(z) = 2\pi \frac{z^{-1}}{1-z^{-1}}$$

Combining the above equations shows that the noise at the output of the feedback counter equals $$n^2(f) = e_{rms}^2(f)[\Delta\Sigma(f)]^2[P(f)]^2$$

which simplifies to $$n^2(f) = \frac{1}{3}\frac{\pi^2}{N^2 f_{REF}}\left[2\sin\left(\frac{\pi f}{f_{REF}}\right)\right]^{2(L-1)}$$

Figure 3B:
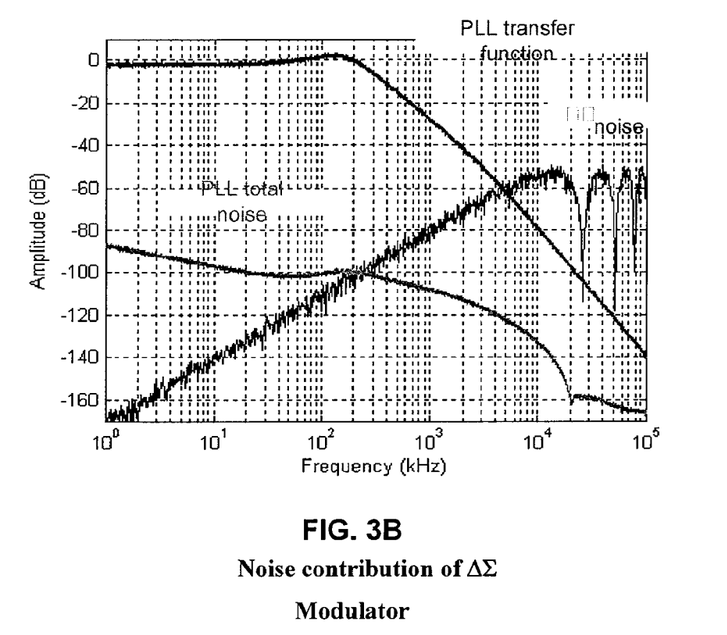
FIG. 3B shows a graph of the noise contribution of a delta-sigma modulator as shown in FIG. 3A.

Ultimately, this noise must be attenuated by the loop filter and PLL transfer function to avoid excessive $\Delta\Sigma$ noise at the output of the PLL as shown in FIG. 3B.

Figure 4A:
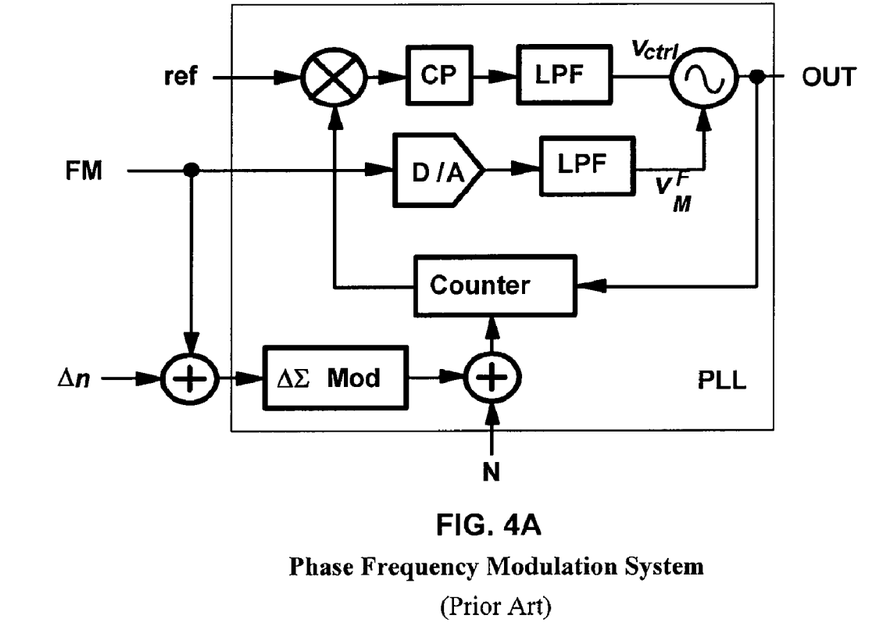
FIG. 4A shows a block diagram of a phase/frequency modulation system.
Figure 4B:
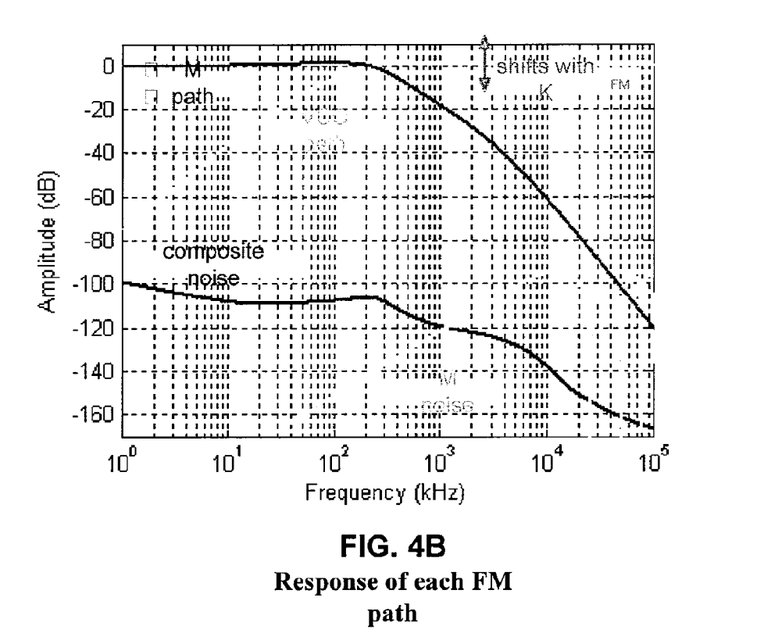
FIG. 4B shows a diagram of the response associated with each of the modulation paths.

To support wideband direct phase/frequency modulation, the fractional-N phase-locked loop adds a direct path to the VCO as shown in FIG. 4A. This modifies the VCO output to $$v_{out}(t) = A\cos\left[\omega t + K_{VCO}\int v_{ctrl}(t)dt + K_{FM}\int v_{FM}(t)dt\right]$$

where $K_{VCO}$ and $K_{FM}$ represent the sensitivity of the control port and the direct frequency modulation port, respectively. The FM signal also feeds the $\Delta\Sigma$ modulator and the feedback counter. This results in two paths for the FM signal as illustrated in FIG. 4B and described by the transfer functions $$\Delta f = \frac{K_{PD}Z(s)K_V}{sN + K_{PD}Z(s)K_V}FM \quad \Delta f = \frac{sNK_{FM}}{sN + K_{PD}Z(s)K_V}\alpha FM$$

where KPD is the charge pump's gain, Z(s) is the impedance presented by the loop filter, $K_V$ is the VCO's sensitivity at the tuning port, N is the value of the feedback counter, $K_{FM}$ is the VCO's gain at the modulation port, and $\alpha$ is a scaling parameter. Ideally, these two functions combine to realize a flat response. That is, the $\Delta\Sigma M$ path's response transitions smoothly to the VCO path's response and holds their combination at unity (0 dB). By its nature, the frequency modulation developed through the $\Delta\Sigma$ modulator is exact while, in contrast, the modulation formed at the VCO is sensitive to its gain $K_{FM}$ and the accuracy of scaling parameter $\alpha$.

Figure 5A:
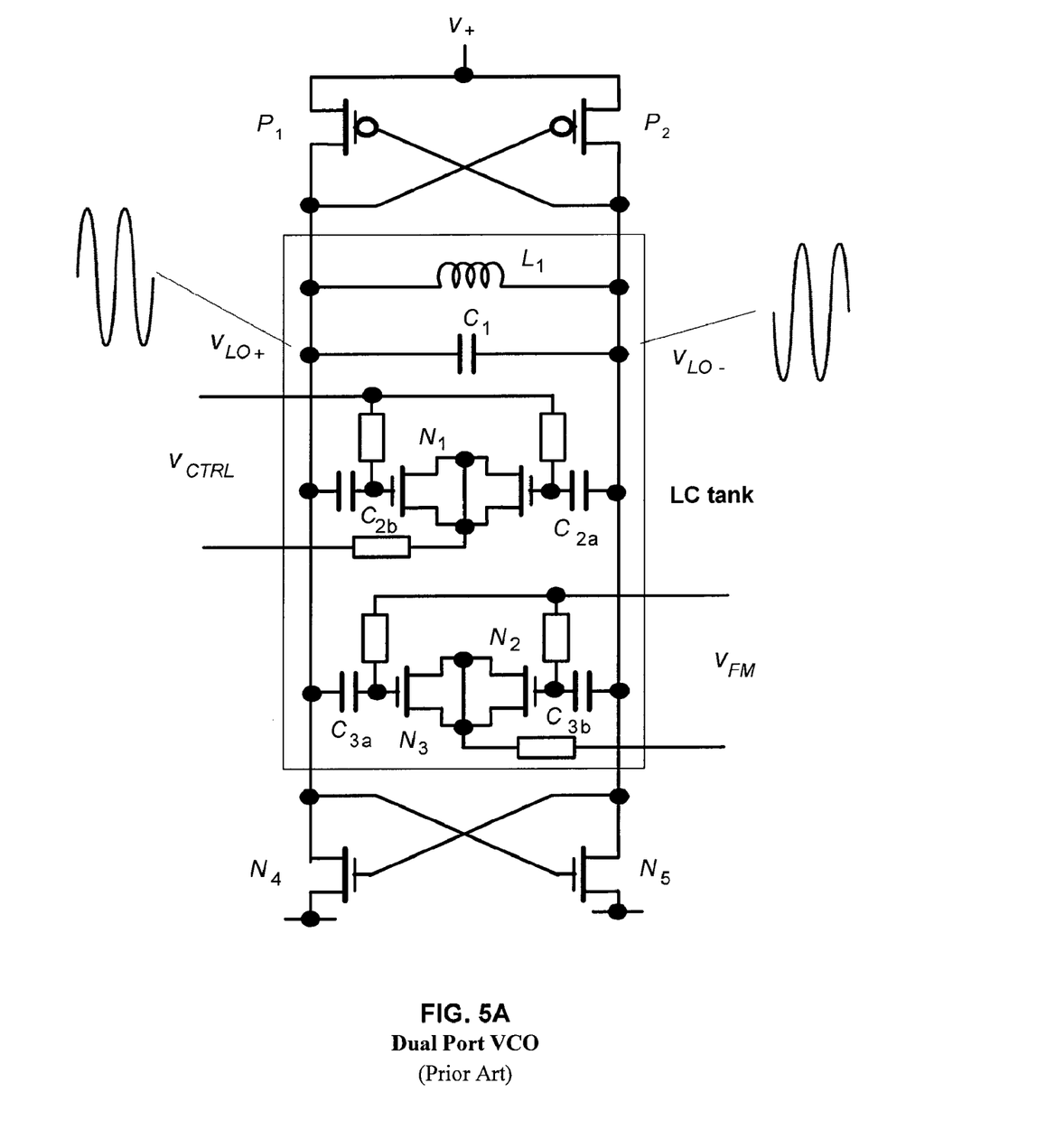
FIG. 5A shows a diagram of a dual port VCO.
Figure 5B:
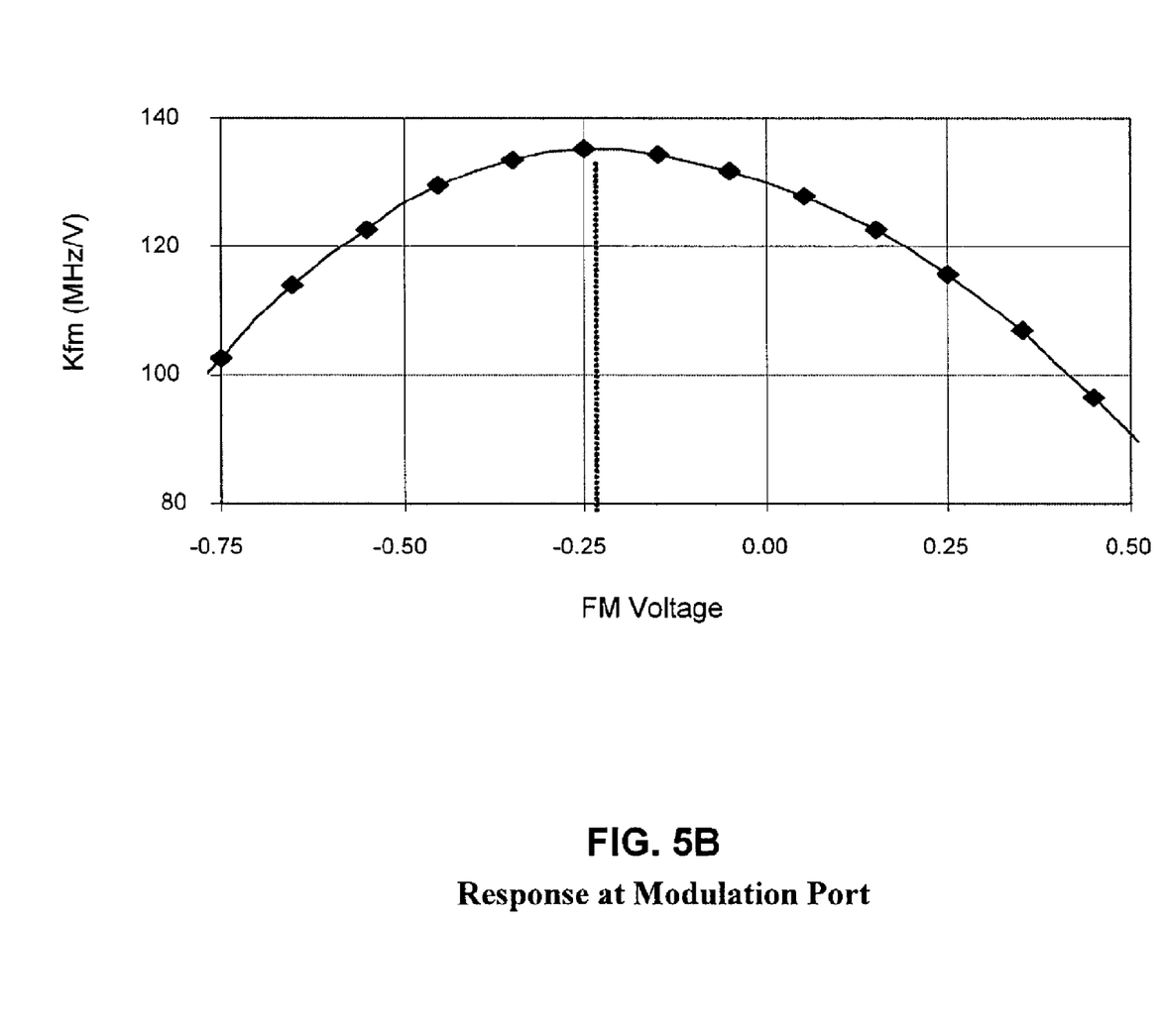
FIG. 5B shows the response of the dual port VCO of FIG. 5A at the modulation port.

A key component of a direct phase/frequency modulator is a VCO such as the one shown in FIG. 5A. It uses complimentary MOS devices to replenish the losses in the LC resonator. The LC resonator consists of a differential inductor, coarse-tuning capacitors (not shown), and two variable capacitance structures based on accumulation-mode MOSFET devices. The accumulation-mode devices normally display an abrupt response, but impressing the large VCO signal across two back-to-back devices tends to linearize the response as shown in FIG. 5B. This is particularly important for wideband frequency modulation.

Figure 6:
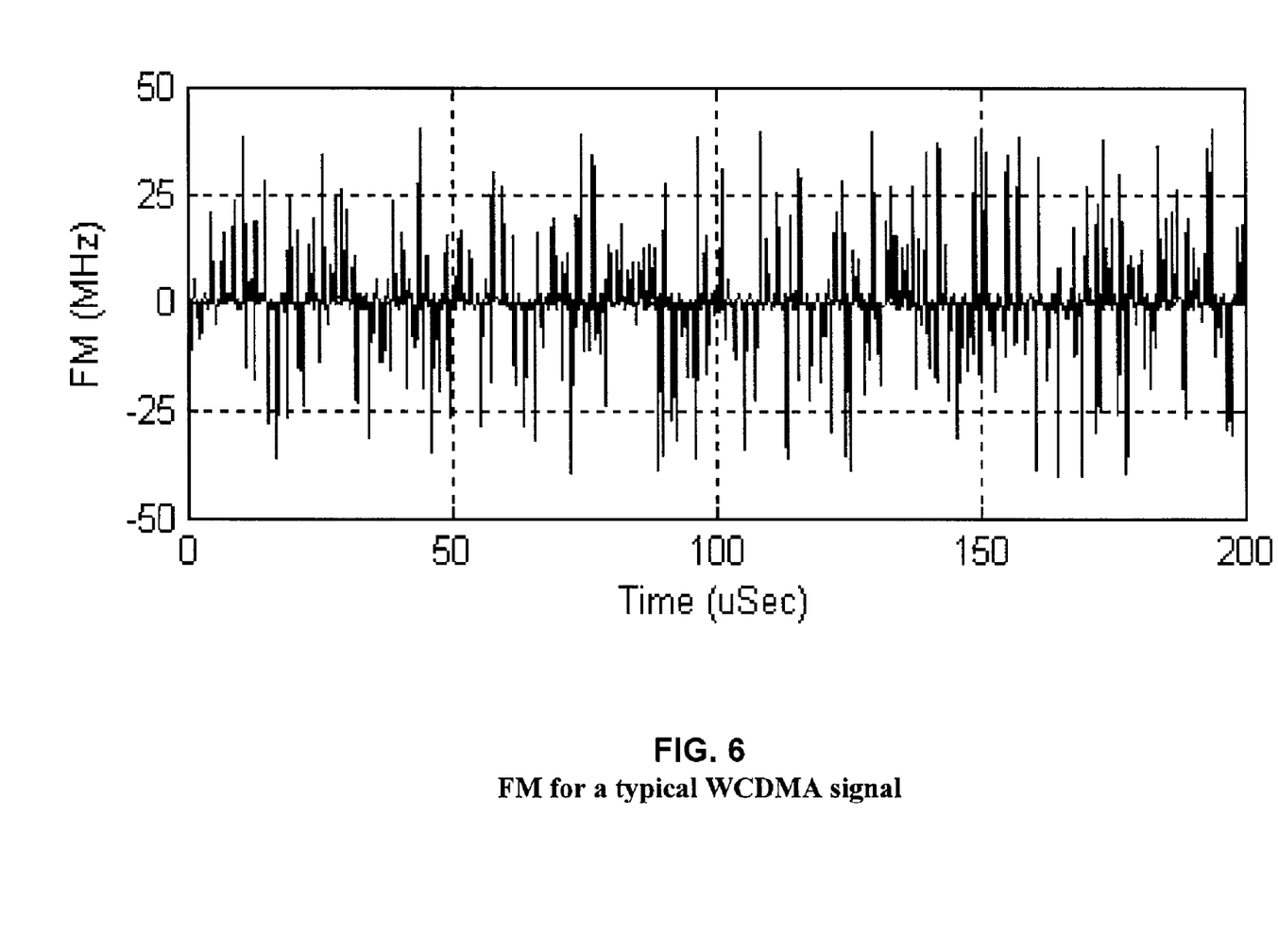
FIG. 6 shows the FM signal for a typical WCDMA transmit signal.

By design, signals applied to the control and modulation ports change the phase/frequency of the VCO output. Unfortunately, the VCO cannot discriminate between intended signals and noise. It therefore becomes important to minimize the noise as well as the sensitivity of these ports. Adding coarse-tuning capacitors to subdivide the VCO range lowers the sensitivity of the control port. Unfortunately, the nonlinear operations that formed the FM signal produced impulses as strong as one-half the FM data rate as shown in FIG. 6.

In accordance with aspects of the present invention, it is possible to cut these FM impulses in half by extending the AM signal (also denoted herein as "extended AM"). The strong FM impulses correspond to phase shifts approaching $\pm\pi$. In practice, a phase shift of exactly $\pm\pi$ can be achieved by inverting the AM signal. This allows the strong FM impulses to map to a modified phase trajectory $\theta'$ given by $$\theta' = \theta \pm n\pi$$

where $\theta$ is the original phase and $n\pi$ represents the phase shift assigned to the AM signal. Since a phase shift of $\pi$ corresponds to an FM level exactly equal to one-half the FM data rate, the modified FM impulse equals $$FM' = FM \pm \frac{1}{2}FM_{rate}$$

Moreover, the portion of the FM level represented by $\frac{1}{2}FM_{rate}$ is simply and accurately realized by inverting the AM signal. In essence, this operation folds the strong FM impulse and effectively reduces the resulting or residual FM deviation.

Figure 7A:
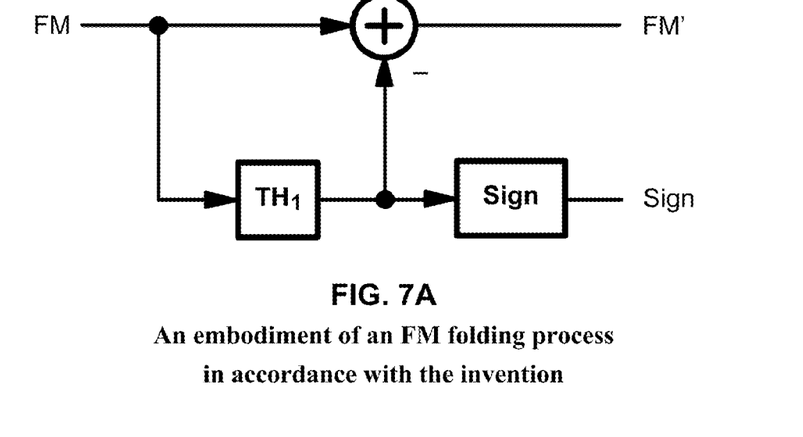
FIG. 7A shows on embodiment of an FM folding process and apparatus in accordance with the present invention.

One simplified embodiment of an apparatus for doing this is illustrated in FIG. 7A. FIG. 7A shows an implementation of the folding operation at the threshold, $TH_1$. The polarity of the AM signal is inverted and the equivalent FM step is removed from the FM signal whenever it exceeds the predetermined threshold.

Figure 7B:
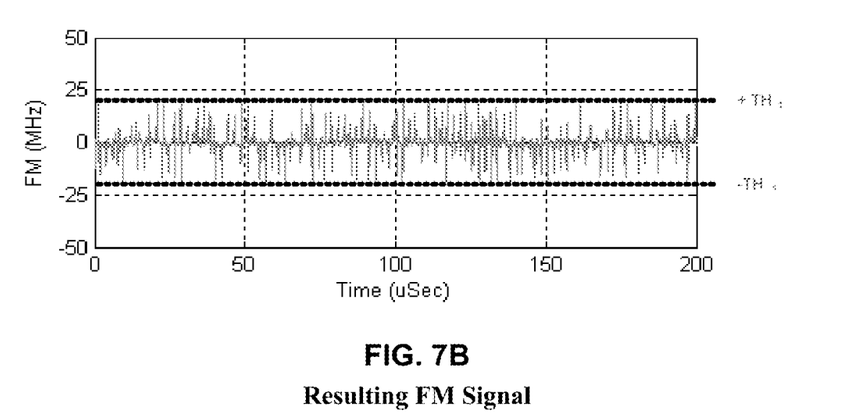
FIG. 7B shows a resulting mapped FM signal from the embodiment of FIG. 7A.

If the threshold is set to $$TH_1 = \frac{1}{4}FM_{rate}$$

the FM peaks fold over as shown in FIG. 7B. This effectively halves the FM range while doubling the AM range.

Figure 7C:
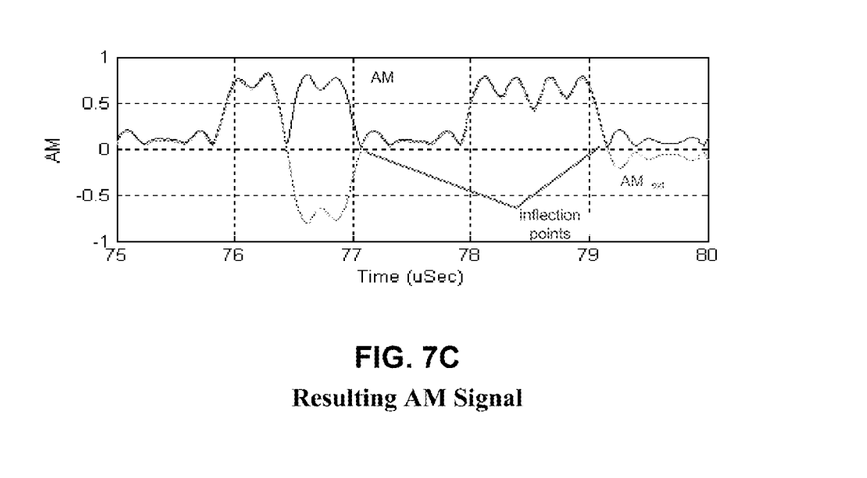
FIG. 7C shows a resulting mapped AM signal.

Conveniently, these strong FM impulses only occur when the AM signal moves towards zero. As a result, extending the AM signal actually smoothes the signal by removing inflections near zero, as shown in FIG. 7C.

Figure 8:
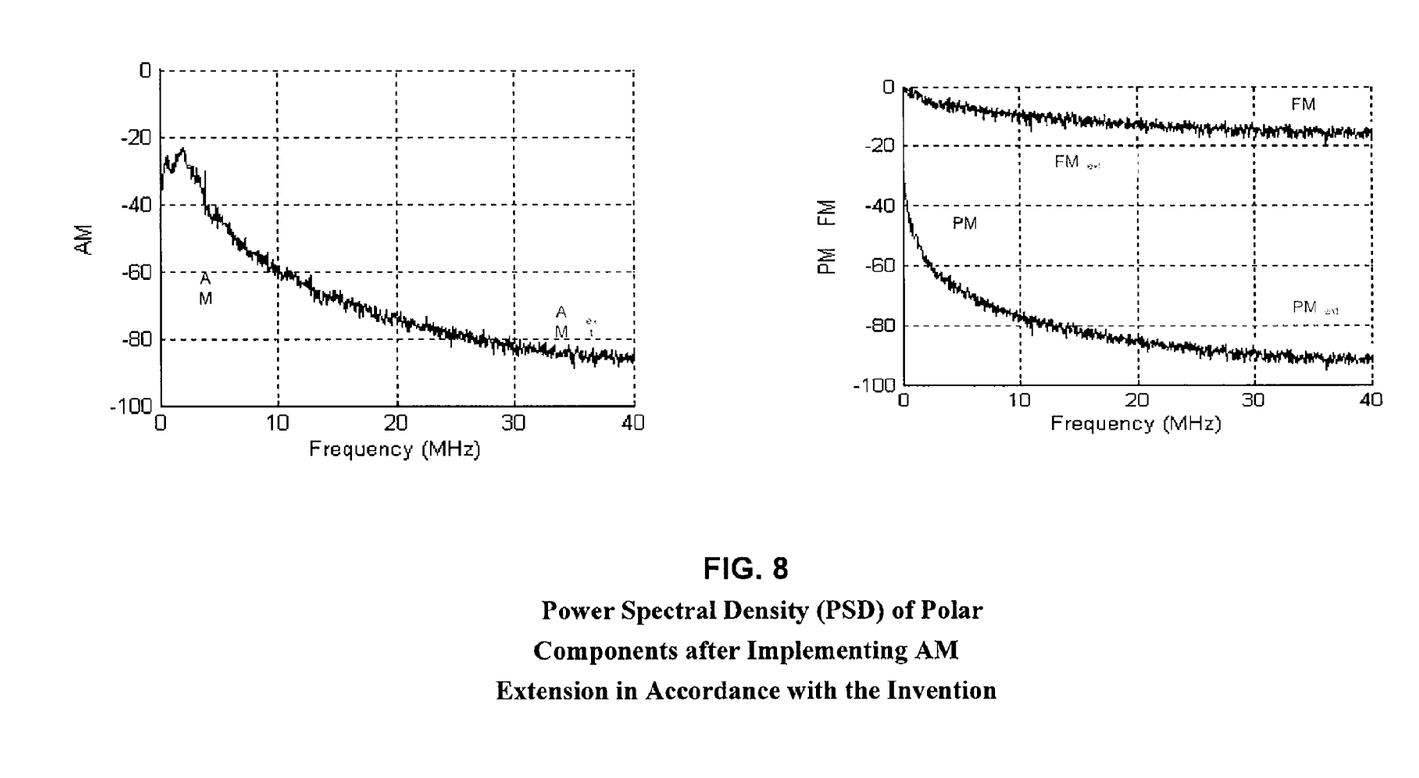
FIG. 8 shows the resulting power spectral density for the AM and FM signal after AM extension, in accordance with aspects of the present invention.

Additionally, embodiments of this extended AM approach can cut the peak FM requirement, thereby easing the design of the VCO. For example, in an exemplary embodiment the peak FM requirement is cut approximately in half. In addition, the extended AM approach can also favorably reshape the FM spectrum. This is shown in FIG. 8 based on an exemplary embodiment.

Figure 9:
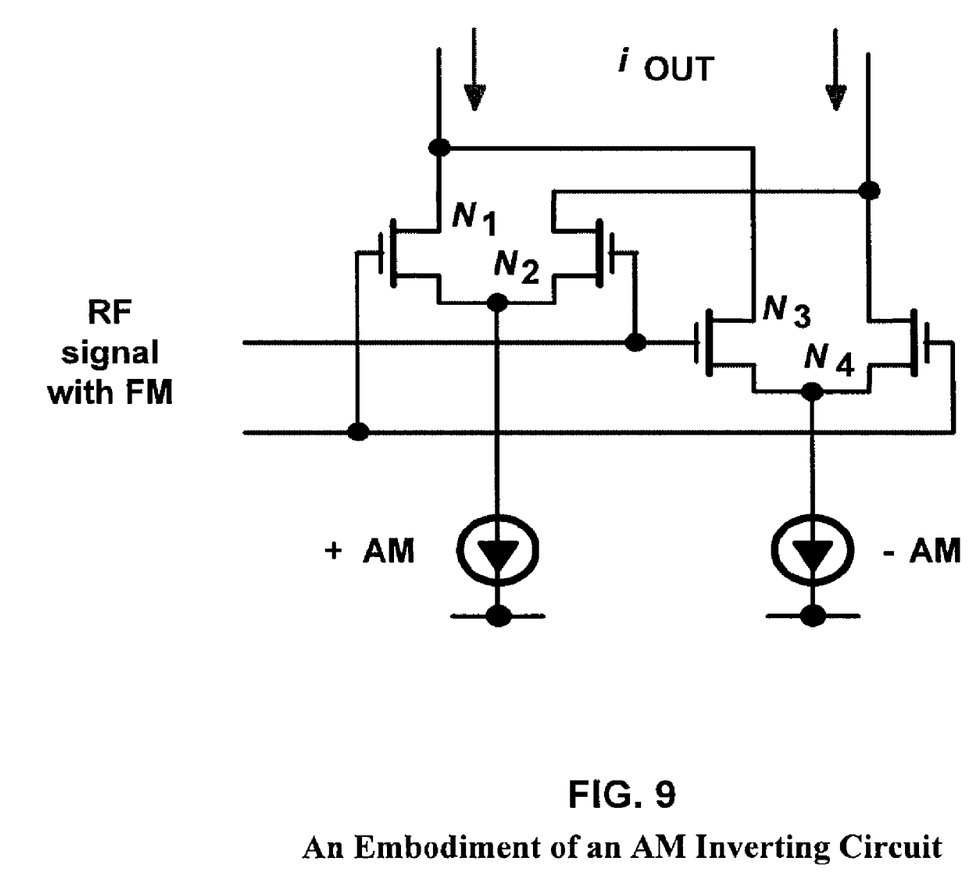
FIG. 9 shows a diagram of an embodiment of a circuit used to invert the composite transmit signal, in accordance with aspects of the present invention.

One embodiment of an apparatus for implementing aspects of the extended AM approach is shown in FIG. 9. The circuit shown in FIG. 9 inverts the transmit signal to realize the AM inversion. The circuit operates as follows. A frequency modulated RF signal drives the differential pairs formed by transistors $N_1$-$N_2$ and $N_3$-$N_4$ and effectively commutates the AM current represented by the sources AM+ and AM−. Ideally, only one of these sources is active based on the polarity of the AM signal. Since the outputs of the two differential pairs are cross-coupled, their outputs are opposite. As a result, switching the active AM source inverts the transmit signal.

Alternatively, the AM sources do not need to be completely switched as long as the difference between them represents the AM signal, including the polarity.

In typical embodiments, the extended AM approach may use relatively simple circuits to cut the peak FM deviation in half, thereby reducing the required VCO range and simplifying its design.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. An apparatus for reducing FM deviation in a polar modulator, comprising:
   a detection circuit configured to determine when an FM signal component of a modulation signal applied to said polar modulator has exceeded a predetermined deviation;
   an FM processing circuit including an FM mapping circuit configured to selectively map the FM signal component to a mapped FM signal component having a reduced FM deviation, wherein said FM mapping is responsive to said determining; and
   an AM processing circuit including an AM mapping circuit configured to selectively map an AM signal component of the modulation signal to a mapped AM signal component, wherein said AM mapping is responsive to said determining.

2. The apparatus of claim 1 wherein said determining includes detecting when the amplitude of said FM signal component has exceeded a predefined FM threshold.

3. The apparatus of claim 2 wherein said predefined FM threshold is set to approximately one quarter of the FM rate of said modulation signal.

4. The apparatus of claim 1 wherein said AM mapping circuit is configured to generate said mapped AM signal component by selectively inverting, responsive to said determining, the polarity of the AM signal component.

5. The apparatus of claim 4 wherein said AM mapping circuit comprises a mapped AM signal circuit for generating inverted and non-inverted AM signals; and
   a mapped AM selection circuit configured to select, responsive to said determining, one of the inverted and non-inverted AM signals as the mapped AM signal component.

6. The apparatus of claim 5 wherein said mapped AM signal circuit comprises a first and a second circuit of a differential pair driven by the modulation signal, said second circuit having a signal that is polarity inverter from said first circuit and wherein said first and said second circuits are coupled to a corresponding first and second current source.

7. The apparatus of claim 6 wherein one of said first and said second current sources is selectively driven based on said determining.

8. The apparatus of claim 2 wherein said FM mapping circuit is configured to generate said mapped FM signal component by subtracting, responsive to said determining, an amount representative of said predefined FM threshold from said FM signal component.

9. The apparatus of claim 8 wherein said predefined FM threshold is set to approximately one quarter of the FM rate of said modulation signal.

10. A method for reducing FM deviation in a polar modulator, comprising:
   determining when an FM signal component of a modulation signal applied to said polar modulator has exceeded a predetermined deviation;
   selectively mapping the FM signal component to a mapped FM signal component having a reduced FM deviation, wherein said mapping is responsive to said determining; and
   selectively mapping an AM signal component of said modulation signal to a mapped AM signal component, wherein said mapping is responsive to said determining.

11. The method of claim 10 wherein said determining includes detecting when the amplitude of said FM signal component has exceeded a predefined FM threshold.

12. The method of claim 11 wherein said predefined FM threshold is set to approximately one quarter of the FM rate of said modulation signal.

13. The method of claim 10 wherein said selectively mapping an AM signal includes selectively inverting, responsive to said determining, the polarity of the AM signal component.

14. The method of claim 13 wherein said inverting comprises generating inverted and non-inverted AM signals, and selecting, responsive to said determining, one of the inverted and non-inverted AM signals.

15. The method of claim 11 wherein said mapping the FM signal component to a mapped FM signal component comprises subtracting, responsive to said determining, an amount representative of said predefined FM threshold from said FM signal component.

16. The method of claim 15 wherein said predefined FM threshold is set to approximately one quarter of the FM rate of said modulation signal.

17. A polar modulator, comprising:
   a VCO having AM and FM input ports and a modulation output port;
   a detection circuit configured to determine when an FM signal component of a modulation signal applied to said polar modulator has exceeded a predetermined deviation;
   an FM processing circuit including an FM mapping circuit configured to generate a mapped FM signal component by subtracting, responsive to said determining, an amount representative of said predefined threshold from said FM signal component, wherein said mapped FM signal component is coupled to an FM input port of said VCO; and
   an AM processing circuit including an AM mapping circuit configured to generate a mapped AM signal component by selectively inverting, responsive to said determining, the polarity of an AM signal component of said modulation signal, wherein said mapped AM signal component is coupled to an AM input port of said VCO.

18. The apparatus of claim 17 wherein said determining includes detecting when the amplitude of said FM signal component has exceeded a predefined FM threshold.

19. The apparatus of claim 18 wherein said predefined FM threshold is set to approximately one quarter of the FM rate of said modulation signal.

20. The apparatus of claim 17 wherein said AM mapping circuit comprises a mapped AM signal circuit for generating inverted and non-inverted AM signals; and
   a mapped AM selection circuit configured to select, responsive to said determining, one of the inverted and non-inverted AM signals.

21. The apparatus of claim 20 wherein said mapped AM signal circuit comprises a first and a second circuit of a differential pair driven by the modulation signal, said second circuit having a signal that is polarity inverter from said first circuit, and wherein said first and said second circuits are coupled to a corresponding first and second current source.

22. The apparatus of claim 21 wherein one of said first and said second current sources is selectively driven based on said determining.

\* \* \* \* \*